United States Patent
Holfeld et al.

(10) Patent No.: US 7,299,105 B2
(45) Date of Patent: Nov. 20, 2007

(54) METHOD AND SYSTEM FOR CONTROLLING A PRODUCT PARAMETER OF A CIRCUIT ELEMENT

(75) Inventors: Andre Holfeld, Dresden (DE); Jan Raebiger, Dresden (DE); Lutz Herrmann, Dresden (DE)

(73) Assignee: Advanced Micro Devices, Inc., Austin, TX (US)

(*) Notice: Subject to any disclaimer, the term of this patent is extended or adjusted under 35 U.S.C. 154(b) by 270 days.

(21) Appl. No.: 11/030,863

(22) Filed: Jan. 6, 2005

(65) Prior Publication Data

US 2005/0192700 A1 Sep. 1, 2005

(30) Foreign Application Priority Data

Feb. 27, 2004 (DE) .................. 10 2004 009 516

(51) Int. Cl.
*G06F 19/00* (2006.01)
(52) U.S. Cl. .................. 700/121; 700/98; 702/187
(58) Field of Classification Search ........... 700/121, 700/12, 29, 108–110, 98; 702/187; 438/174, 438/217; 257/E21.268; 703/13, 2
See application file for complete search history.

(56) References Cited

U.S. PATENT DOCUMENTS

| | | | |
|---|---|---|---|
| 5,863,824 A | 1/1999 | Gardner et al. | 438/303 |
| 6,136,616 A | 10/2000 | Fulford et al. | 438/14 |
| 6,365,422 B1 | 4/2002 | Hewett et al. | 438/14 |
| 6,409,879 B1 | 6/2002 | Toprac et al. | 156/345.24 |
| 6,728,587 B2* | 4/2004 | Goldman et al. | 700/108 |
| 6,821,859 B2 | 11/2004 | Raebiger et al. | 438/303 |
| 6,856,849 B2* | 2/2005 | Riley et al. | 700/121 |
| 6,912,437 B2 | 6/2005 | Chong et al. | 700/121 |
| 6,959,224 B2 | 10/2005 | Good et al. | 700/97 |
| 2003/0129774 A1* | 7/2003 | Christian et al. | 438/10 |

FOREIGN PATENT DOCUMENTS

| | | |
|---|---|---|
| WO | WO 01/97297 A2 | 12/2001 |
| WO | WO 02/09170 A2 | 1/2002 |
| WO | WO 02/082534 A2 | 10/2002 |

\* cited by examiner

*Primary Examiner*—Kidest Bahta
(74) *Attorney, Agent, or Firm*—Williams, Morgan & Amerson, P.C.

(57) ABSTRACT

Methods and systems are disclosed that allow an adjustment of a product parameter, such as operating speed, of a circuit element, such as a field effect transistor, during the fabrication of the device. A manufacturing process downstream of a first controlled process is controlled by a superior control scheme in response to the measurement data of the first and second processes and on the basis of a sensitivity function, which describes the effect a variation of the product parameter generates in the measurement data. The superior control scheme may provide a compensated target value for the downstream process.

31 Claims, 5 Drawing Sheets

METHOD AND SYSTEM FOR CONTROLLING A PRODUCT PARAMETER OF A CIRCUIT ELEMENT

BACKGROUND OF THE INVENTION

1. Field of the Invention

The present invention relates to the field of fabricating semiconductor devices including circuit elements, such as field effect transistors (FETs), and, in particular, to a method and system for improved control of the manufacturing process of circuit elements to more reliably stabilize an electrical property of the completed devices.

2. Description of the Related Art

The dimensions of modern integrated circuits are steadily shrinking, while at the same time providing both improved device performance and circuit density. Both advantages are mainly obtained by steadily shrinking the feature sizes of the individual field effect transistor elements, such as MOS transistors, whereby critical dimensions, i.e., minimum feature sizes that can be reproducibly printed onto the substrate, are currently approaching the 0.1 µm range, and further reductions are anticipated in the future. The formation of modern ultra-high density integrated circuits may require approximately 500 individual process steps, wherein one of the most critical steps is the formation of the gate electrode of the field effect transistors. The gate electrode controls, upon application of a suitable control voltage such as 2-3 volts or even less in modern CPUs, the current flow through a channel that forms below a thin gate insulation layer separating the gate electrode from the underlying semiconductor region. Generally, the gate electrode is designed to have a width dimension on the order of micrometers and less and a length dimension, also referred to as gate length, currently on the order of 0.1 µm. This gate length, which represents the distance between the highly doped source and drain regions of the field effect transistor, significantly affects the device performance with respect to signal propagation time and current flow from the source to the drain. Trimming the gate length down to a size of about 0.1 µm necessitates an enormous effort to establish an appropriate lithography technique and a sophisticated etch trim method, wherein any deviation from a target value of the gate length significantly contributes to a variation of the electrical properties of the completed transistor element. In particular, the on-current and the off-current, i.e., the current that flows when a conductive channel is formed between the source and the drain region and the current that flows when the conductive channel is not formed, as well as the switching speed, are greatly influenced by the gate length.

Generally, a reduced gate length leads to an increased on-current and to an increased switching speed of the transistor element. At the same time, however, the off-current, i.e., the undesired leakage current, also increases with a smaller gate length owing to an increased electrical field in the vicinity of the gate electrode. Accordingly, a reduced gate length compared to the target value, although improving speed of the transistor element, may result in a lower yield of the completed transistor elements due to the increased and thus intolerable leakage current. On the other hand, an increased gate length compared to the target value enhances the transistor characteristics with respect to leakage current, but entails a lower on-current and a lower speed of the transistor. As a consequence, circuit designers have to take into account the variation of the electrical properties of the individual transistor elements owing to manufacturing tolerances in forming elements of critical dimensions, thereby posing constraints on the performance of the entire circuit.

As a consequence, process engineers are making great efforts to develop process control strategies to reduce fluctuations of the individual process steps as much as possible to achieve a high performance of the end product. To this end, so-called advanced process control (APC) methods are steadily being designed and enhanced, in which typically pre-process inline data and post-process inline data are analyzed and used to control the process under consideration with minimal time delay, preferably on a run-to-run basis. However, at least some important device characteristics, such as operational speed, depend on a plurality of process steps, wherein a slight deviation in some of the processes, although well within a tight process window for each process, may still result in a significant deviation of the desired behavior of the device, for instance in terms of speed, yield, reliability and the like.

In view of the above problems, a need exists for an enhanced control scheme to more efficiently control product parameters and electrical properties such as the on-current and the off-current, the switching speed and the like during fabrication of the field effect transistors.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that enables the reduction of process variations in a process sequence by providing a "supervising" control scheme that may re-adjust the control activity in one or more processes of the process sequence. The supervising control scheme may include information relating one or more product parameters to inline measurement data used to control individual processes so that the supervising control scheme may compensate for even slight variations of the process sequence on the basis of this information, thereby providing the potential for selecting tighter margins for one or more key product parameters.

According to one illustrative embodiment of the present invention, a method of controlling a product parameter of a circuit element comprises performing a first controlled manufacturing process on the basis of first process measurement data to form a first pre-form of the circuit element. Moreover, a second controlled manufacturing process is performed on the basis of second process measurement data to form a second pre-form of the circuit element. Finally, the second controlled manufacturing process is controlled on the basis of the first process measurement data and a correlation of the first and second measurement data with the product parameter.

According to still a further embodiment of the present invention, a method of controlling a product parameter of a circuit element comprises performing a first manufacturing process that is controlled by a first APC application to form a first pre-form of the circuit element. The method further comprises performing a second manufacturing process that is controlled by an APC application to form a second pre-form of the circuit element. Moreover, the second manufacturing process is controlled on the basis of the first APC application and second APC application and product measurement data indicative of the product parameter.

In yet another illustrative embodiment of the present invention, a multi-step APC control system comprises a first APC controller configured to control a first manufacturing process and a second APC controller configured to control a second manufacturing process. The system further comprises a control unit connected to the first and second APC controllers, wherein the control unit is configured to determine a compensated target value for the second APC controller on the basis of measurement data used by the first APC controller and sensitivity information relating the measurement data to a product parameter of a circuit element formed by at least the first and second manufacturing processes.

BRIEF DESCRIPTION OF THE DRAWINGS

The invention may be understood by reference to the following description taken in conjunction with the accompanying drawings, in which like reference numerals identify like elements, and in which.

Figure 1A:
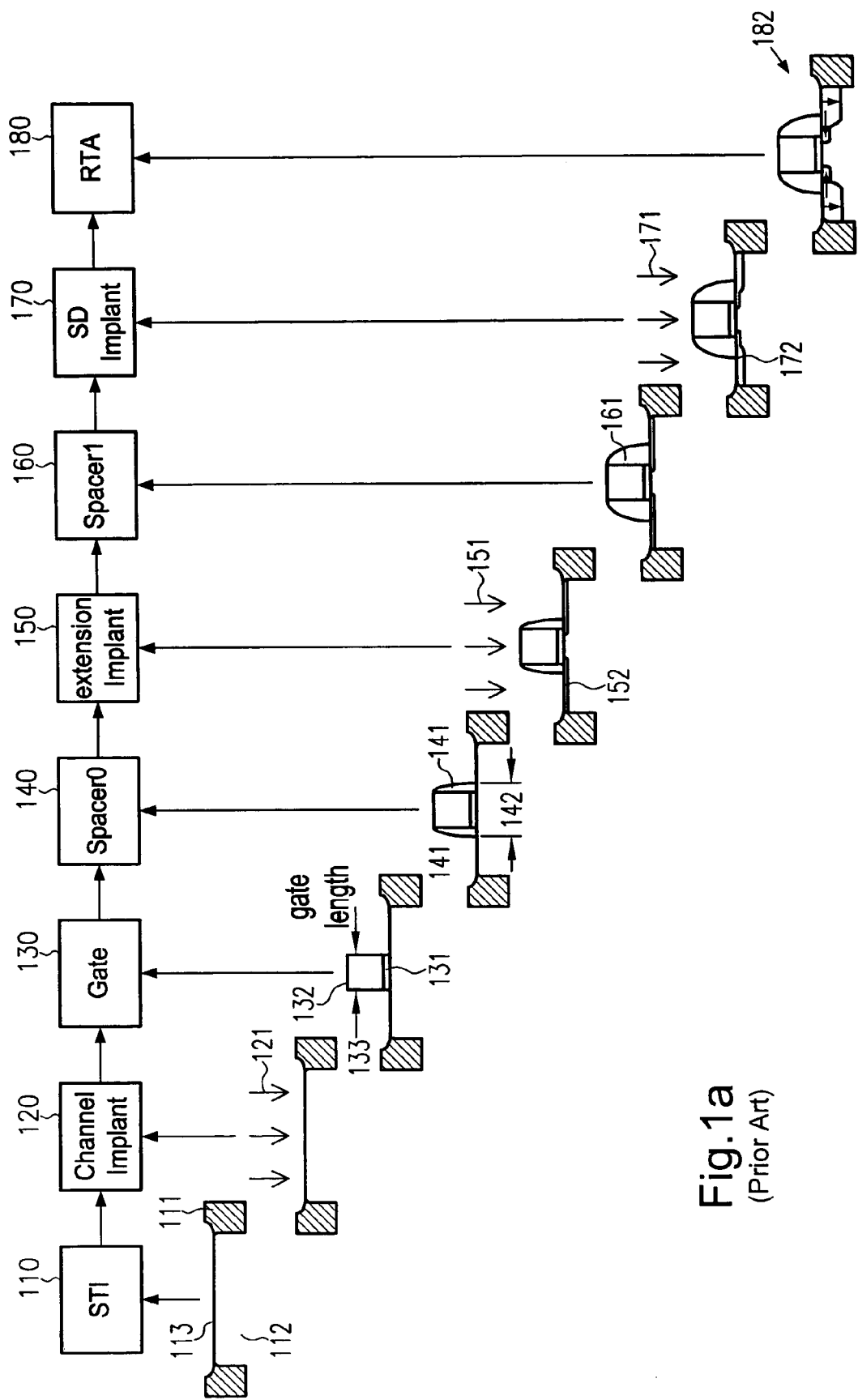
FIG. 1a schematically represents a process flow in manufacturing a field effect transistor.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present invention is based on the finding that any variation of the gate length during the complex process steps for forming a gate electrode of a field effect transistor may be compensated, at least partially, by one or more subsequent process steps in which process parameters can reliably and reproducibly be re-adjusted.

With reference to FIG. 1a, the individual process steps in a typical process flow for forming a circuit element such as a field effect transistor, for instance in the form of a MOS transistor, will briefly be discussed.

In FIG. 1a, a first process step 110, also referred to as a shallow trench isolation (STI), describes a manufacturing stage in which shallow trench isolations 111, for example comprised of silicon dioxide, are formed in a semiconductor substrate 112 to define an active region 113 in which a field effect transistor is to be formed.

Next, a process step 120, also referred to as a channel implant, indicates a manufacturing stage in which the substrate 112 is exposed to a beam of ions 121 to implant a specified dopant concentration within the active region 113 that is appropriate to achieve the required channel characteristics, in terms of charge carrier concentration, mobility and the like, of the field effect transistor to be formed.

Thereafter, in step 130, also referred to as gate formation, a gate insulation layer 131 is formed on the active region 113 and a gate electrode 132 is patterned on the gate insulation layer 131 from a polysilicon layer. The gate electrode 132 defines a width direction (not shown) perpendicular to the drawing plane of FIG. 1a and a length direction in the drawing plane and substantially parallel to the surface of the active region 113. An extension of the gate electrode 132 in the length direction, as indicated by the arrows 133, is also referred to as a gate length.

Next, in a process step 140, a spacer element 141, which is also often referred to as a spacer 0, is formed adjacent to the gate electrode 132 at the sidewalls thereof. The spacer element 141 is comprised of a dielectric material, such as silicon dioxide or silicon nitride. Typically, forming the spacer element 141 includes blanket depositing the dielectric material and subsequently removing the dielectric material by a selective anisotropic etching process, wherein the initial layer thickness of the dielectric material and/or the step coverage of the dielectric material over the gate electrode 132 and/or the over-etch time, i.e., the etch time after the dielectric material has been substantially completely removed on top of the gate electrode 132 and the surface portions of the active region 113 spaced apart from the gate electrode 132, determine a final maximum extension 142 of the spacer element 141, i.e., in FIG. 1a, a footprint of the spacer element 141 in the length direction. Usually, the process parameters for depositing the dielectric material, adjusting the step coverage and performing the anisotropic etching are relatively well-known and well-controllable so that the maximum extension 142 of the spacer element 141 may be well-adjusted.

Next, in step 150, an ion implantation is carried out, indicated by the arrows 151, with a moderate dose and with an appropriate type of ion to form doped regions 152, also referred to as extensions, adjacent to the gate electrode 132. This is sometimes referred to as an extension implant process. It should be noted that the spacer element 141 acts as an implantation mask during the implantation step and thus influences the implantation profile of the lightly doped regions 152. It is also to be noted that while the spacer element 141 acts as an implantation mask, it does not prevent all implanted ions from migrating into the region below the spacer element 141 as is illustrated in FIG. 1a. The reason for this is that the ions are subjected to diffusion once they have penetrated the active region 113, especially as a heat treatment is performed later to activate any implanted ions and to partially re-crystallize the lattice structure of the substrate.

Next, in step 160, a second spacer element 161, also referred to as spacer 1, is formed adjacent to the sidewalls of the gate electrode 132, wherein the second spacer element 161 may or may not be formed of the same material as the spacer element 141 and formation of the second spacer element 161 may include substantially the same process steps as is explained with reference to the spacer element 141.

In step 170, also referred to as SD implant, an ion implantation process is carried out, indicated by the arrows 171, to form source and drain regions 172 in the active region 113. As with the spacer element 141, the second spacer element 161 also acts as an implantation mask to reduce the number of ions entering the region below the second spacer element 161.

In step 180, as previously explained, a heat treatment is performed to activate the implanted ions within the extension regions 152 and the drain and source regions 172.

Thereafter, further processes, such as forming a metal silicide on the gate electrode 132 and the drain and source regions 172, may follow to obtain a completed field effect transistor 182.

For evaluating the product parameters including the electrical characteristics of the field effect transistor 182, at least one of the following properties may be measured: production yield, reliability, that is life time during specified stress conditions, the on-current (drive current), the off-current, the rise and fall time when a corresponding signal is applied to the gate electrode, that is the switching time, and the frequency of an oscillator in which one or more field effect transistors 182 form a part of the oscillator. In this respect, it should be noted that, regarding the above-indicated electrical properties and other product characteristics, such as yield and reliability, PMOS transistors substantially behave like NMOS transistors with the exception that the transistor on-current of the PMOS transistor is smaller than that of an NMOS transistor of comparable transistor size owing to the different type of charge carriers. Accordingly, although the process flow in FIG. 1a and in the following figures is described with reference to an NMOS transistor, the discussion is also valid for PMOS transistors and complementary transistor pairs when the difference in on-current of the various transistor types is taken into consideration. For example, experimental data for complementary transistor pairs may be evaluated by defining a switching speed that is the minimum speed of the NMOS transistor and the PMOS transistor.

In conventional process strategies, typically metrology steps are performed at selected points of the above-described manufacturing sequence 100. For example, the step 130 for forming the gate electrode may include a preceding measurement step, for instance in order to obtain measurement readings concerning a resist feature used to etch the gate electrode 132. After etching the gate electrode 132 a post-etch measurement may be performed to determine the actual gate length 133. Based on these measurement results and an appropriate control model, the step 130 may be controlled by an APC scheme to ensure a high yield of the process step 130 even for ever-decreasing process window margins. Corresponding process control strategies are employed for at least some of the processes of the sequence 100. It turns out, however, that even slight deviations from the target values in at least some highly sensitive processes of the individual processes of the sequence 100 may result in noticeable deviations in product parameters and in final electrical tests. The present invention is based on the concept that deviations in electrical and other product parameters may be compensated for or at least reduced on the basis of measurement data of a first controlled process and measurement date of a second controlled process downstream of the first process, wherein, additionally, corresponding sensitivity data, representing a correlation between measurement data and electrical or other product parameters, are used to at least "supervise" the second controlled process.

Figure 1B:
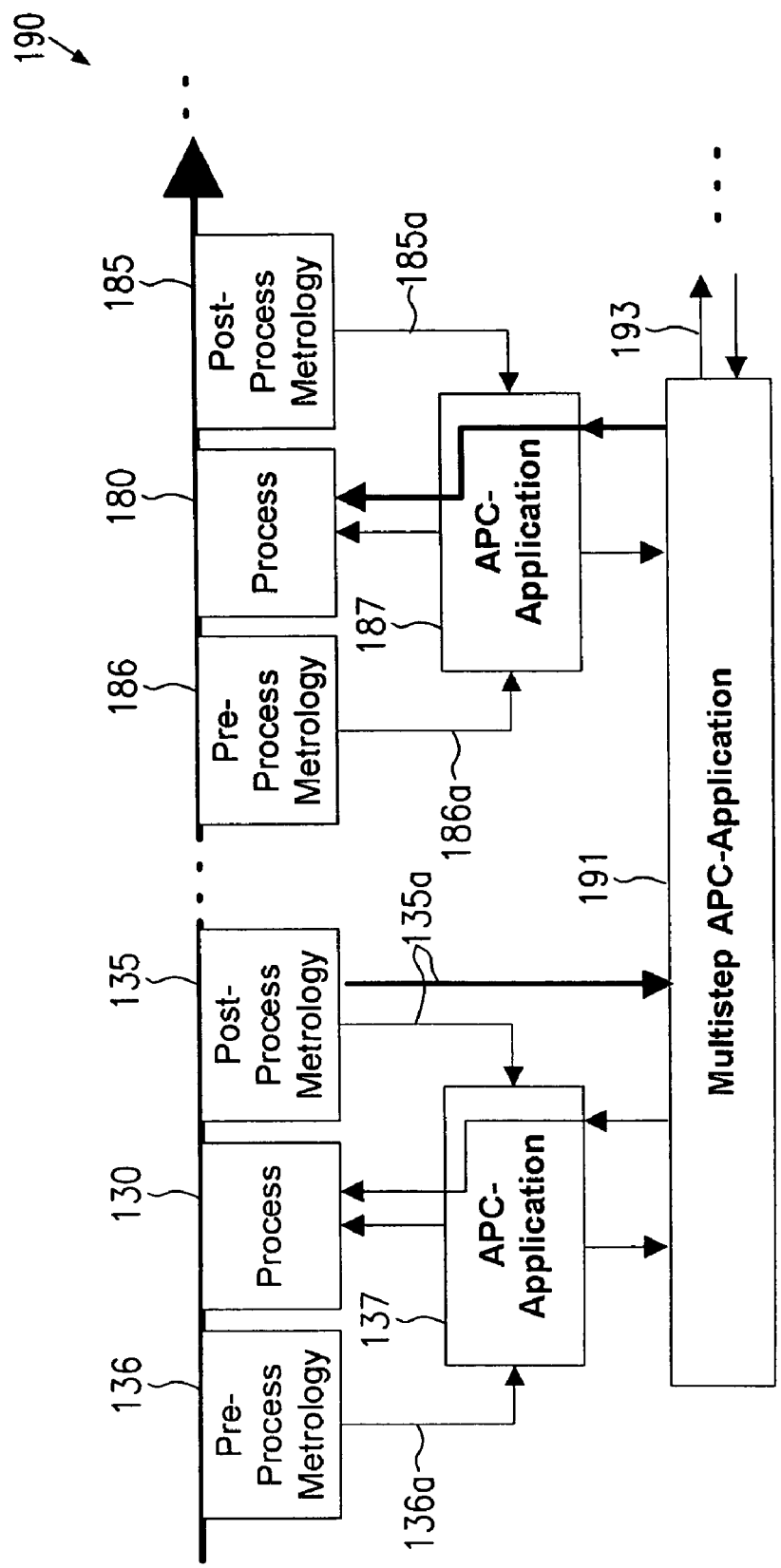
FIG. 1b schematically illustrates a control scheme according to exemplary embodiments of the present invention.

FIG. 1b schematically illustrates a corresponding control scheme 190, which may be implemented in the form of a system including any appropriate hardware, such as computers, controllers, microprocessors, communication lines and the like, wherein, as an illustrative example, a first process may be represented by the step 130 and a second process downstream of the first process may be represented by the RTA step 180. It should be appreciated that the control scheme 190 may be used in combination with any other processes that are considered effective to reduce product specific parameter fluctuations. In particular, the control scheme 190 may include more than two individual processes. Referring to the illustrative embodiment describing a reduction in parameter fluctuation by controlling an RTA parameter target value on the basis of gate length variations and appropriate sensitivity data, the control scheme 190 thus comprises the gate formation process 130 and the RTA process 180, wherein, in particular, the process 130 includes a post-process metrology step 135 that produces post-process measurement data 135a. The process 130 may further include a pre-process metrology step 136 creating corresponding pre-process measurement data 136a. The process 130 may be controlled by a first APC application 137.

Similarly, the process 180 may in some embodiments include a post-process metrology step 185 generating post-process measurement data 185a. The process 180 may also include a pre-process metrology step 186 that creates pre-process measurement data 186a. The process 180 may be controlled by a second APC application 187. It should be appreciated that the metrology steps 135 and/or 136 and/or 185 and/or 186 and thus the correspondingly generated measurement data may not necessarily directly relate to the circuit element under consideration, i.e., in the present example the gate electrode 132 and the completed transistor 182, but may alternatively or additionally concern tool specific parameters and the like. For instance, the second APC application 187 may mainly be based on tool parameters regarding the temperature and ambient conditions as pre- and post-process measurement data 186*a*, 185*a* to provide a desired diffusion behavior. It is also to be noted that any pre- and post-process measurement data may be gathered with one or more additional process steps performed between the measurement and the actual process, which is controlled based on the measurement data.

Moreover, the scheme 190 comprises a "multi-step" APC application 191 that communicates with the application 137 and that receives the post-process measurement data 136*a*. The APC application 191 is also configured to communicate with the application 187 and to control the application 187. In a particular embodiment, controlling the application 187 is accomplished by establishing an updated target value and supplying the same to the application 187. The multi-step application 191 may also communicate, indicated as 192, with other APC applications or with external sources. In particular, the multi-step application 191 may receive, via the communication 192, sensitivity data or data indicative of the relation between one or more product parameters and one or more process parameters of the processes 130 and 180. In other embodiments, respective sensitivity data may be stored or created within the multi-step application 191.

The operative principle of the multi-step application 191 is based on the concept that a set of product parameters $\vec{P}$ including electrical parameters is interrelated to a set of inline measurement data $\vec{p}$, such as one or more of the pre- and post-measurement data 135*a*, 136*a*, 185*a*, 186*a*, by the sensitivities $\vec{S}$ quantifying the dependence of the measurement data on the product parameters. The parameters, the measurement data and the sensitivities may mathematically be treated as vectors and matrices and the above interrelation may be expressed by the following Equation 1:

$\vec{P} = P(1 \ldots n) \ldots$ product parameters $\vec{p} = p(1 \ldots m) \ldots$ inline measurement data $\vec{S} \ldots$ sensitivities of inline measurements to product parameters $$\vec{P} = \vec{S} \cdot \vec{p} \qquad \text{Equation 1}$$

Based on Equation 1, an expected deviation $\vec{P}_{Delta}$ of the product parameters $\vec{P}$ may be obtained by a comparison of the inline measurement data $\vec{p}$ with respective target values $\vec{P}_T$ of the inline measurement data $\vec{p}$. This is shown in the following Equation 2:

$\vec{p}_T = p_T(1 \ldots m) \ldots$ inlinetargets $$\vec{P}_{Delta} = \vec{S} \cdot (\vec{p} - \vec{p}_T) = \vec{S} \cdot \vec{p}_{Delta} \qquad \text{Equation 2}$$

Hence, the deviation of the measurement data $\vec{p}$ from the target values $\vec{P}_T$ may be obtained by using Equation 2.

Then, new, compensated or updated target values $\vec{P}_{T,compensated}$ may be determined as a function f of the sensitivities $\vec{S}$, the inline target values $\vec{p}_T$ and the inline measurement data $\vec{p}$, as is expressed in the following Equation 3:

$$\vec{p}_{Delta} = \vec{S}^{-1} \cdot \vec{P}_{Delta}$$

$$\vec{p}_{T,compensated} = \vec{p}_T - \vec{p}_{Delta} = f(\vec{S}, \vec{p}_T, \vec{p}) \qquad \text{Equation 3}$$

The compensated target values $\vec{p}_{T,compensated}$ may then be used to control the upstream APC application to compensate for or reduce fluctuations in the product parameters under consideration. The sensitivities $\vec{S}$ and the function f may be determined by experiment and/or theoretically using common knowledge, experience and previously obtained measurement data.

Figure 2:
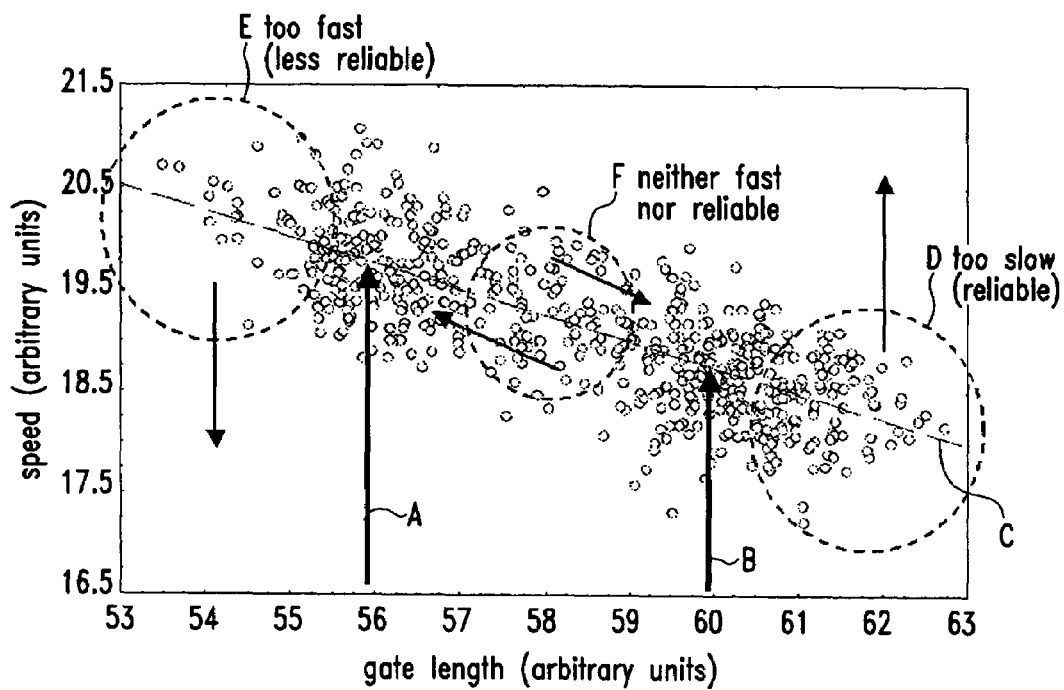
FIG. 2 shows measurement results depicting the relationship between the gate length and the operating speed of field effect transistors.

FIG. 2 shows representative measurement results obtained from a plurality of field effect transistors, such as the transistor 182, that have been formed on a plurality of separate substrates. In FIG. 2, the vertical axis represents the switching speed of the field effect transistors, whereas the horizontal axis represents the gate length of the respective field effect transistors. For the example of FIG. 2, two differing target values A and B for the gate length 132 have been established in accordance with process variations to obtain "high" speed (hot) substrates, thereby taking a loss in yield and reliability, and to obtain "low" speed (cold) candidates with improved yield and reliability, thereby taking a loss in performance. From FIG. 2 it is observable that the gate length of the various field effect transistors varies strongly for the processed substrates with significant concentrations at the cold target value B and the hot target value A. The dependence of the switching speed, representing here an electrical parameter, on the gate length 132 may be described as a linear function C, although other interrelations may be used if considered appropriate. A goal of the control scheme 191 in this illustrative embodiment may thus be directed at reducing the "distance" in performance of the products represented by the target values A and B, or at least reducing the deviation in the electrical parameter and other parameters of "hot" and "cold" products. That is, devices in the region D, i.e., devices exhibiting high reliability, however at reduced speed, may be processed in the RTA process 180 with a compensated target value to speed up these devices. The devices in the region E exhibiting high speed, however at significantly reduced reliability and yield, may be processed in the RTA treatment 180 with a corresponding target value to slow down the devices. Devices in the region F may be "shifted" to obtain "hot" devices or "cold" devices, depending on process requirements.

Since the gate length 132 and other parameters can be measured within the production line, the information contained in the measurement results may be used in subsequent process steps to adjust other process parameters to compensate for variations of electrical properties of the field effect transistors caused by the gate length variations. According to the above-identified multi-step APC application 191, process parameters of process steps following the gate formation step 130 may be controlled such that, in the final device, the product parameters of interest remain within a specified range. This holds true for any interrelated controlled processes, in which the effect of one process with respect to a product parameter of interest may, at least to some degree, be influenced in one or more downstream processes.

One basic mechanism of an illustrative embodiment relating the process steps 130 and the RTA step 180 that may be used in reducing the variation of the electrical property of the field effect transistor will be discussed with reference to FIG. 3.

Figure 3:
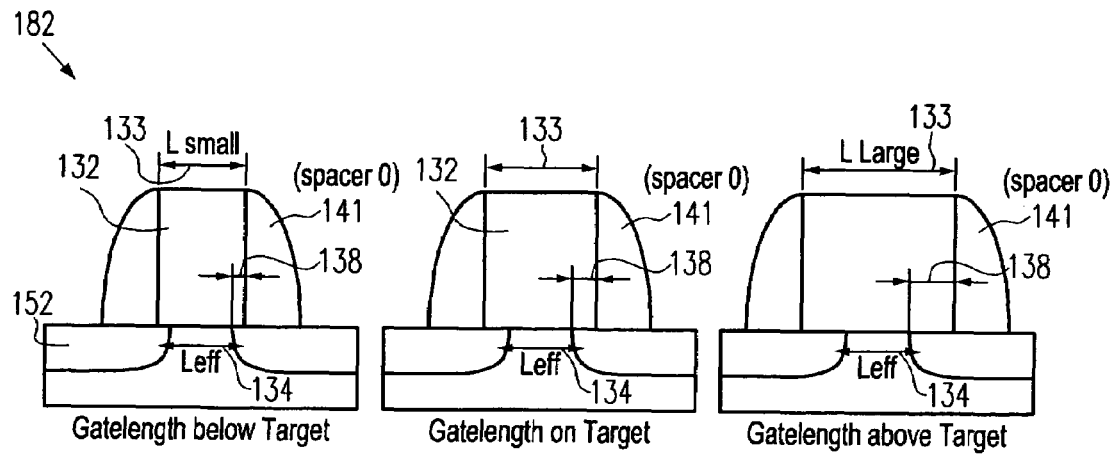
FIG. 3 schematically depicts the basis concept for controlling an electrical property of a field effect transistor according to one illustrative embodiment.

In FIG. 3, a schematic cross-sectional view of three variations of a field effect transistor 182 is depicted. For convenience, the same numeration is adhered to as in FIG. 1a. In the left part of FIG. 3, a first variation of the field effect transistor 182 is illustrated. The gate electrode 132 exhibits the gate length 133 and the distance between the extension regions 152 defines a channel length or an effective gate length 134. Generally, the effective gate length 134 is less than the gate length 133 due to an overlap 138 of the extension regions 152 with the gate electrode 132. It is, however, the effective gate length 134 that, among others, has a remarkable impact on the electrical characteristics of the field effect transistor 182. It is thus possible to control a variation of the effective gate length 134 that will be obtained, according to the conventional process flow 100 shown in FIG. 1, in conformity with a variation of the gate length 133 when the RTA process 180 is performed without being controlled on the basis of the post-process measurement data 135a.

In the conventional process flow, as described with reference to FIG. 1, the maximum extension 142 of the spacer element 141 is maintained substantially constant, that is, only a randomly distributed, slight variation occurs. As previously discussed, the process parameters, and thus the complete process steps for forming the spacer element 141, are well-established and the formation of the spacer element 141 is accordingly highly reproducible with only moderate variations. As a consequence, the overlap 138 of the extension regions 152 with the gate electrode 132 will exhibit approximately the same minor variations as the maximum extension 142 of the spacer element 141 since this maximum extension 142 substantially determines the masking effect of the spacer element 141 during the implant 150. The effective gate length 138 may be significantly influenced by the RTA step 180 in that, for instance, the temperature is varied to control the average diffusion distance of the dopants in the lateral (and of course in the vertical) dimension. In the variation shown in the left portion of FIG. 3, the measured gate length 133 is smaller than a predefined target value of the gate length and consequently the RTA temperature may correspondingly be reduced to substantially obtain a desired effective gate length 134.

In the center portion of FIG. 3, a second variation of the field effect transistor 182 is depicted, wherein the measured gate length 133 is substantially equal to the desired gate length, and thus the effective gate length 134 is substantially equal to a desired target value for a specified target value of the RTA process 180.

The right portion of FIG. 3 shows a third variation of the field effect transistor 182 in which the gate length 133 exceeds the desired gate length after the gate formation step 130 in FIG. 1. Accordingly, the RTA temperature in the RTA process 180 is correspondingly increased so that the effective gate length 134 is substantially equal to the desired effective gate length, thereby, however, also increasing the overlap 138.

Due to the varying overlap 138, when adapting the RTA process 180 to the process variations of the step 130, in some embodiments, the sensitivity of the RTA process parameter may be determined by simulation and/or experimental data, wherein also the varying overlap 138 may be taken into account as the overlap 138 causes a parasitic capacitance in the transistor 182, which affects transistor performance. Thus, varying the RTA target value to achieve a substantially constant effective gate length 134 may, in some embodiments, be appropriate, whereas, in other embodiments, a more complex non-linear relation between the gate length 133 and the effective gate length 134 may be used. That is, in FIG. 3, for the transistor 182 at the right-hand side, the effective gate length 134 may be reduced to take into consideration the increased parasitic capacitance caused by the increased overlap 138.

Thus, with reference to FIGS. 1a and 1b, a typical process flow of the control scheme 190 based on the processes 130 and 180 may comprise the following steps. After forming the gate electrode 132, the gate lengths 133 of at least some of the gate electrodes formed in step 130 are determined by measurement and are input into the APC application 137 and the multi-step APC application 191 that is operatively connected to process tools (not shown) used in step 130. As is well known, the gate length may be measured, for example, optically by means of a scatterometer or any other appropriate means that is usually provided within the production line. The measurement results of the gate length are then entered as the post-process measurement data 135a into multi-step APC application 191, which is configured to output compensated target values for one or more process parameters for adjusting process tools involved in performing the RTA process 180. For instance, the target value for the maximum RTA temperature may be communicated to the APC application 187 together with substrate specific information so that the APC application 187 may identify the one or more substrates that also created the corresponding post-process measurement data 135a.

It is to be noted that the measured gate lengths, i.e., the post-process measurement data 135a obtained in step 130 do not necessarily need to be correlated directly with the compensated target value for the RTA temperature, but may, in one illustrative embodiment, be correlated directly with the tool parameters controlling the RTA process 180. That is, the feed forward control provided by the multi-step APC application 191 may supply a control signal to the respective process tool, such as a laser tool, an RTA oven and the like, whereby a specific type of control signal is assigned to a measured gate length value or a certain range of measurement values. A corresponding correlation may be provided, for example, in the form of one or more tables and/or by calculation when a mathematical representation for the correlation has been established. Moreover, in other embodiments, the correlation between the post-process measurement data 135a and the finally used target RTA temperature may be selected so that, as is depicted in FIG. 2, an allowable range of gate lengths is defined in advance for a change of the target RTA temperature. For instance, for post-process measurement data 135a within the areas centered around the "hot" target gate length A and the "cold" target gate length B, no change of the target RTA temperature may be determined, while for measurement data 135a within the ranges E, F and D, compensated target values may be obtained on the basis of previously established sensitivities, as is also explained with reference to FIG. 1b. An illustrative embodiment for determining compensated target values for the ranges D, E and F will be described later with reference to FIG. 4. Using a range of the post-process measurement data 135a without providing compensated target values for the RTA temperature may be advantageous in view of control loop stabilization, as the values for the product parameter(s) under consideration, i.e., in the present example, the device speed, may exhibit a certain variation for a given gate length, as may be seen from FIG. 2. However, in other embodiments, various other control strategies may be selected, such as correlating the amount of change of the target RTA temperature to further post- and pre-process measurement data obtained from processes upstream and/or downstream of the process 130. For example, corresponding sensitivities may be established with respect to the correlation between the product parameter(s) under consideration and the post-process measurement data of the channel implant 120 and/or the extension implant 150 and/or the spacer 0 process 140, and the like. In this case, the variations of the product parameter under consideration, i.e., in FIG. 2 the transistor speed, may, at least to a certain degree, be identified as being caused by one or more of the other processes so that the product parameter under consideration may more efficiently be confined to a desired value as is for instance represented by the fit curve C in FIG. 2.

In one particular embodiment, the sensitivity of the post-process measurement data 135a, i.e., the gate length measurement data, and the sensitivity of the RTA process with respect to the transistor speed may be selected as linear functions. In this respect, it should be appreciated that the sensitivity of the RTA may be considered as depending on the measurement data 185a and/or 186a to be in conformity with the above-given definition of the sensitivity S. That is, the temperature actually used or actually selected at the RTA tool may be considered as post-process measurement data and pre-process measurement data, respectively, so that the corresponding sensitivity may describe a corresponding linear correlation, in this particular embodiment, between the actually used RTA temperature, the post-process measurement data 185a, or the temperature adjusted at the RTA tool, the pre-process measurement data 186a. Moreover, the control scheme 190 in the multi-step APC application 191 may, in one embodiment, in view of enhanced control stability, be based on the condition that the RTA process 180 be controlled between a predefined range. That is, a maximum and a minimum threshold may be selected for the amount of variation of the target RTA temperature value supplied to the APC application 187 by the multi-step application 191. In another embodiment, a step-wise constant model for determining a compensated RTA target value in response to the post-process measurement data 135a may be selected, wherein the step width and the step height may be obtained empirically and may, in some embodiments, be adjusted in accordance with measurement results of the product parameter under consideration. Similarly, the respective sensitivities and the functional relationship for determining the compensated target value (Equation 3) may be adapted or updated on the basis of such measurement data. In some embodiments, it may be advantageous to "dampen" the control activity of the multi-step application 191 on the APC application 187, for instance, by introducing a corresponding damping factor or damping function.

With reference to Equation 4, an illustrative control strategy as may be implemented in the multi-step application 191 is provided, in which some of the features specified above are combined to achieve a high stability in the feed-forward loop established by the control scheme 190.

$$DF = CD - CD\text{Target} \qquad \text{Equation 4}$$

-continued $$DT_{\text{exact}} = \begin{cases} 0 & \text{if } |DF| \leq CD\_\text{Deadband} \\ -DF \cdot CD\_\text{Damping} \cdot \dfrac{S_{CD}}{S_{RTA}} \end{cases}$$

$$DT_{\text{round}} = \text{trunc}\left(\dfrac{DT_{\text{exact}}}{RTA\_\text{Discretization}}\right) \cdot RTA\_\text{Discretization}$$

$$DT_{\text{used}} =$$

$$\begin{cases} RTA\_\text{MaxAdjust} & \text{if } DT_{\text{round}} > RTA\_\text{MaxAdjust} \\ DT_{\text{round}} \\ -RTA\_\text{MaxAdjust} & \text{if } DT_{\text{round}} < -RTA\_\text{MaxAdjust} \end{cases}$$

Herein DF represents the deviation of the post-process measurement data 135a, here denoted as CD, from the respective target value, CDTarget, that is, DF corresponds to $\vec{p}_{Delta}$ in Equation 3. CD_Deadband represents a range of measurement data 135a for which, in the present embodiment, no compensation of the RTA target temperature is desired, as is previously explained. CD_Damping represents a damping factor as explained above to adapt the effect of the additional control of the multi-step application 191. $S_{CD}$ and $S_{RTA}$ represent the corresponding sensitivities of the measurement data 135a and 185a and/or 186a. In this embodiment, the sensitivities are provided as single numbers. $DT_{exact}$ represents the compensated target value and thus corresponds to $\vec{p}_{T,compensated}$ of Equation 3. Hence, $DT_{exact}$ represents the function $f(\vec{S}, \vec{p}_T, \vec{p})$ of Equation 3. In the next step of Equation 4, the compensated target value $DT_{exact}$ is converted into a form that may be advantageous in view of control stability and feasibility. In this embodiment, the linear function $DT_{exact}$, except for the deadband, is divided into discrete steps as is discussed above to obtain the function $DT_{round}$, wherein the step width is determined by the value RTA_Discretization.

In the last step of Equation 4, a maximum control effect may be defined, which is, in the present embodiment, realized by the introduction of an upper and a lower limit for the compensation of the target value of the RTA. Hereby, RTA_MaxAdjust represents a maximum deviation from a non-compensated target value, that is, from a target value as is provided by the APC application 187 without being controlled by the superordinate multistep application 191. Hence, the value $DT_{used}$ is obtained which may represent the compensated target value supplied to the APC application 187.

Figure 4:
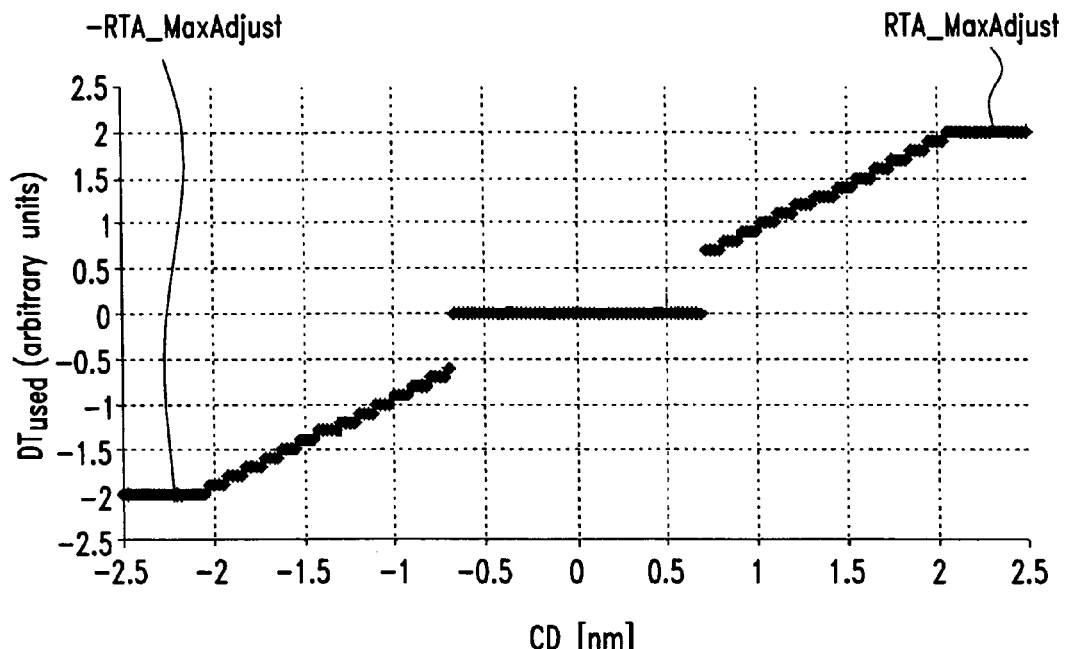
FIG. 4 is a graph depicting a particular embodiment of a multi-step control scheme.

FIG. 4 is a graph illustrating the above-described control scheme 190, wherein $DT_{used}$ on the vertical axis is plotted versus the difference CD of the post-process measurement data 135a and the corresponding target value.

Based on the control scheme 190 as described in Equation 4 and shown in FIG. 4, a plurality of substrates have been processed corresponding to the process sequence 100, wherein the process control of a part of the substrates was performed in a conventional manner, i.e., without the provision of the multi-step application 191 while the other part was subjected to the control scheme 190.

Figure 5:
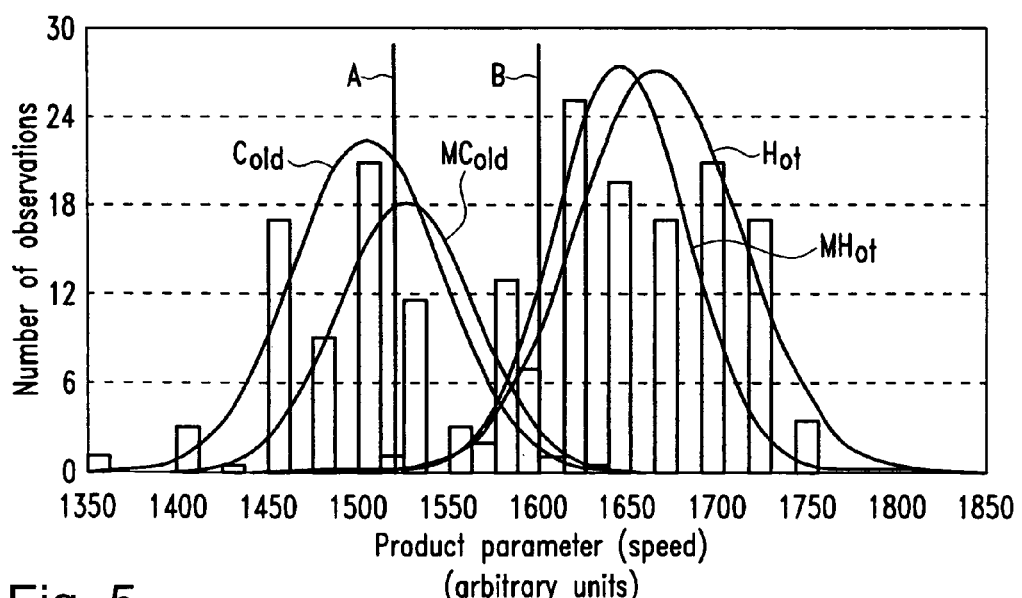
FIG. 5 shows measurement results of a product parameter for substrates including a circuit element manufactured in a conventional manner and in accordance with illustrative embodiments of the present invention.

FIG. 5 shows results of measurements with respect to one product parameter, in the present example the operating speed of the transistors, wherein the curves $C_{old}$ and $H_{ot}$ depict the conventionally processed substrates, whereas the curves $MC_{old}$ and $MH_{ot}$ represent the substrates processed using the multi-step application 191. As is evident from the data, the speed distribution is significantly tighter for the curves $MC_{old}$ and $MH_{ot}$, that is, the variation around a central speed (HOT or COLD) is tightened and the center values of the respective distributions $MH_{ot}$, and $MC_{old}$ are closer to their target values A and B, respectively.

Figure 6:
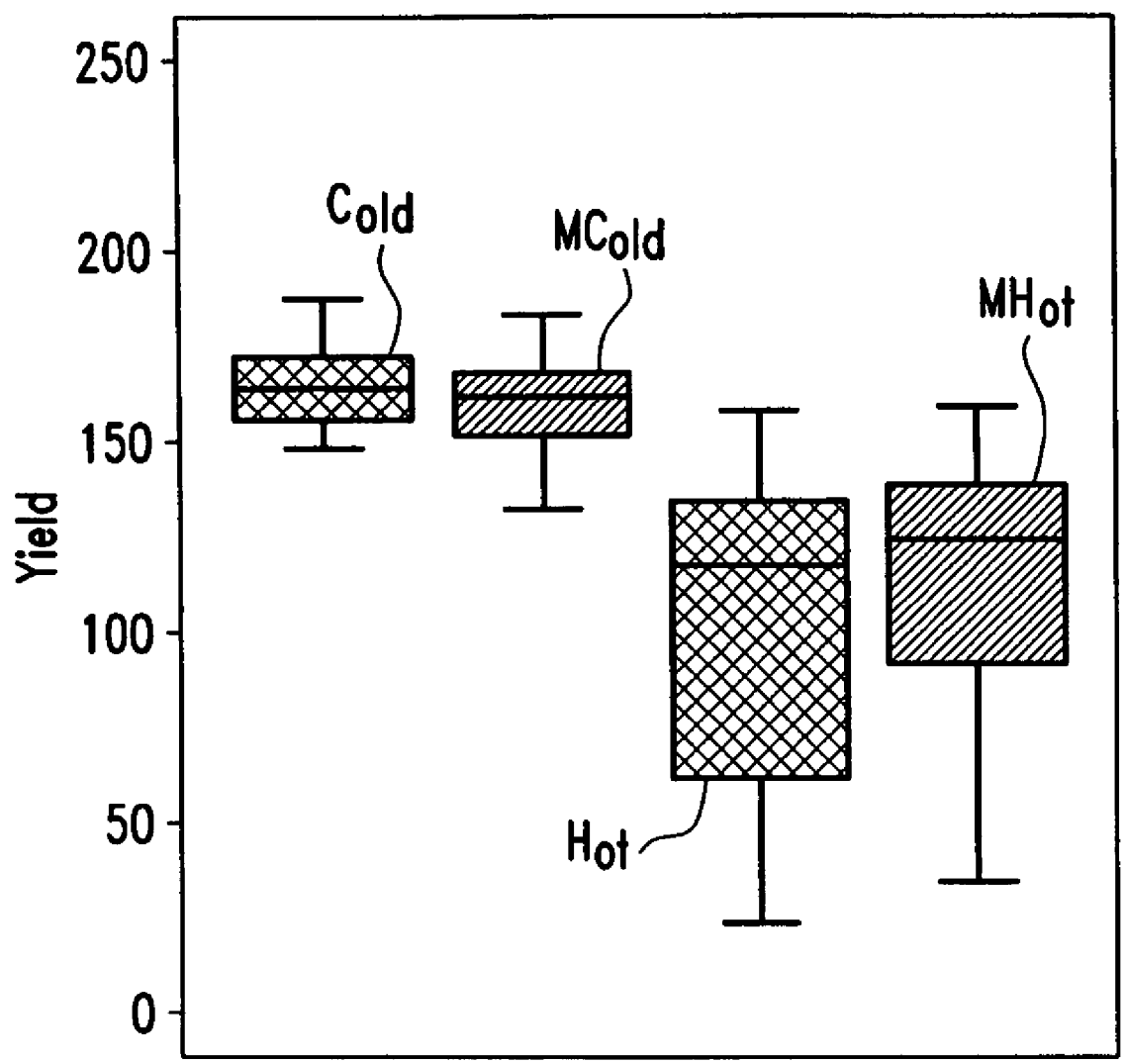
FIG. 6 shows measurement results of a further product parameter for substrates including a circuit element manufactured in a conventional manner and in accordance with illustrative embodiments of the present invention.

FIG. 6 schematically depicts a further product parameter, that is, production yield, for the two different speed target values HOT and COLD. Here, it is evident that production yield for the substrates controlled under the scheme 191 ($MC_{old}$) have only a slight decrease in yield for the benefit of higher speed compared to the conventionally produced substrates ($C_{old}$), while the substrates ($MH_{ot}$) show significantly increased production yield compared to the conventional substrates ($H_{ot}$).

Thus, a significant improvement compared to the conventional APC control strategy is achieved. It may readily be appreciated that the control scheme 190 may be implemented in any desired form, for instance as a stand-alone equipment connected to the APC applications included in the sequence 100 in any hardware and/or software representation. In other cases, the APC applications and the multi-step application 191 may be provided as a combined hardware and/or software application, for instance as part of a superior facility management system.

Moreover, the control scheme 190 may be applied on a single substrate basis, that is, the compensated target value for the destiny APC application may be determined for each substrate, based on corresponding measurement data related to this substrate. In other embodiments, measurement data may be obtained from one or more substrates and may be used in their entirety, for instance by averaging the same, to control a plurality of subsequent substrates based on the entirety of data, thereby providing a common compensated target value for the plurality of substrates.

Furthermore, the sensitivities used may be provided in more complex relations rather than assuming a linear dependence. For example, well-known fit algorithms may be employed to obtain a relation between measurement data of the electrical parameter under consideration and the post-process measurement data. The obtained fit curve may then be made discrete to define a vector representation to allow enhanced handling of the sensitivity in the control scheme 190.

As a result, the present invention provides an enhanced control technique in which conventional APC control strategies of single processes may be enhanced by a superior APC application that controls one or more individual processes to obtain a synergetic effect with respect to one or more product parameters such as speed, yield, reliability and the like. The superior APC application controls, on the basis of measurement data of at least one upstream process, at least one downstream process to compensate for or reduce variations of the at least one upstream process. In one particular embodiment, the at least one downstream process includes an RTA process and the at least one upstream process includes the formation of a gate electrode.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of controlling a product performance parameter of a circuit element, the method comprising:
performing a first controlled manufacturing process on the basis of first process measurement data to form a first pre-form of said circuit element;
performing a second controlled manufacturing process on the basis of second process measurement data to form a second pre-form of said circuit element; and
controlling said second controlled manufacturing process on the basis of said first process measurement data and a correlation of said first and second measurement data with said product parameter, wherein said correlation represents a sensitivity of said first and second measurement data with respect to a variation of said product performance parameter.

2. The method of claim 1, wherein said first measurement data comprise post-process measurement data specifying a characteristic of said first pre-form.

3. The method of claim 2, wherein said first measurement data include pre-process measurement data and said first manufacturing process is controlled on the basis of the pre-process and the post-process measurement data.

4. The method of claim 1, wherein controlling said second controlled manufacturing process comprises determining a compensated target value for said second controlled manufacturing process.

5. The method of claim 1, wherein said circuit element is formed on a first substrate, said first measurement data are obtained for said first substrate and said second controlled manufacturing process is controlled on the basis of said first measurement data for said first substrate.

6. The method of claim 1, wherein said circuit element is formed on a plurality of substrates and said second controlled manufacturing process for said plurality of substrates is controlled on the basis of said first measurement data obtained from said plurality of substrates.

7. The method of claim 1, wherein said second process measurement data comprises second post-process measurement data and said second manufacturing process is controlled on the basis of said second post-process measurement data.

8. The method of claim 1, wherein said second process measurement data comprises second pre-process measurement data and said second manufacturing process is controlled on the basis of said second pre-process measurement data.

9. The method of claim 1, wherein said fist and second controlled manufaturing processes are APC applications determining, on the basis of the fist and second measurement data,respectively, a fist and a second target value for the first and second manufaturing process, respectively.

10. The method of claim 1, wherein said first pre-form of the circuit element has a critical dimension representing a design parameter determining an operating speed of the circuit element.

11. The method of claim 10, wherein said first pre-form represents a gate electrobe.

12. The method of claim 11, wherein said first process measurement data are indicative of a gate length of said gate electrobe.

13. The method of claim 11, wherein said second manufaturing process comprises a rapid thermal anneal (RTA) process for activating dopants implanted adjacent to said gate electrobe.

14. The method of claim 13, wherein controlling said second controlled manufaturing process comprises determining a compensated target temperature for said RTA process and controlling the RTA process on the basis of said compensated target temperature.

15. The method of claim 14, wherein determining said compensated target value comprises establishing an upper and a lower limit for said compensated target value.

16. The method of claim 14, wherein determining said compensated target value comprises determining a range of values of said first process measurement data for which said compensated target value is substantially equal to a target value used in said second controlled manufacturing process.

17. The method of claim 14, wherein determining said compensated target value comprises determining a weighting factor to adjust a control effect of the compensated target value.

18. A method of controlling a product performance parameter of a circuit element, the method comprising:
performing a first manufacturing process that is controlled by a first APC application to form a first pre-form of said circuit element;
performing a second manufacturing process that is controlled by a second APC application to form a second pre-form of said circuit element; and
controlling said second manufacturing process on the basis of said first APC application and second APC application and product measurement data indicative of said product performance parameter, wherein controlling said second manufacturing process comprises determining a correlation quantifying a sensitivity of measurement data used at least the first APC application for a variation in said product performance parameter.

19. The method of claim 18, wherein said first APC application is based on at least first post-process measurement data and controlling said second manufacturing process is based on said first post-process measurement data.

20. The method of claim 19, wherein controlling said second manufacturing process comprises determining a compensated target value for said second APC application.

21. The method of claim 18, further comprising performing a third manufacturing process for forming a third pre-form of said circuit element, said third manufacturing process being controlled by a third APC application, the method further comprising controlling said third manufacturing process on the basis of said first, second and third APC applications.

22. The method of claim 21, wherein controlling said second and third manufacturing processes comprises determining compensated target values for each of the second and third APC applications.

23. The method of claim 18, wherein said first pre-form represents a gate electrode.

24. The method of claim 23, wherein first measurement data used in said first APC application are indicative of a gate length of said gate electrode.

25. The method of claim 24, wherein said second manufacturing process comprises a rapid thermal anneal (RTA) process for activating dopants implanted adjacent to said gate electrode.

26. The method of claim 25, wherein controlling said second manufacturing process comprises determining a compensated target temperature for said second APC application controlling said RTA process.

27. A multi-step APC control system comprising:
a first APC controller configured to control a first manufacturing process;
a second APC controller configured to control a second manufacturing process; and
a control unit connected to the first and second APC controllers, said control unit being configured to determine a compensated target value for said second APC controller on the basis of measurement data used by said first APC controller and sensitivity information relating said measurement data to a product performance parameter of a circuit element formed by at least said first and second manufacturing processes.

28. The multi-step APC system of claim 27, wherein said first manufacturing process comprises a gate electrode formation process and said second manufacturing process comprises a rapid thermal anneal process.

29. The method of claim 1, wherein performing said first controlled manufacturing process further comprises performing said first controlled manufacturing process on the basis of a first target value, performing said second controlled manufacturing process further comprises performing said second controlled manufacturing process on the basis of a second target value, and controlling said second controlled manufacturing process further comprises adjusting said second target value on the basis of said first process measurement data and a correlation of said first and second measurement data with the product performance parameter, wherein said correlation includes a damping term.

30. The method of claim 18, wherein performing said first manufacturing process further comprises performing said first manufacturing process on the basis of a first target value, performing said second manufacturing process further comprises performing said second manufacturing process on the basis of a second target value, and controlling said second manufacturing process further comprises adjusting said second target value on the basis of said first process measurement data and a correlation of said first and second measurement data with the product performance parameter, wherein said correlation includes a damping term.

31. The system of claim 27, wherein said control unit being is further configured to determine said compensated target value on the basis of a damping term.

* * * * *

UNITED STATES PATENT AND TRADEMARK OFFICE
CERTIFICATE OF CORRECTION

PATENT NO. : 7,299,105 B2  Page 1 of 1
APPLICATION NO. : 11/030863
DATED : November 20, 2007
INVENTOR(S) : Andre Holfeld et al.

It is certified that error appears in the above-identified patent and that said Letters Patent is hereby corrected as shown below:

Col. 14 in claim 9, please correct the spelling of the words "manufaturing" to --manufacturing--.
Col. 14 in claim 9, please correct the spelling of the words "fist" to --first--.

Col. 14 in claim 12, please correct the spelling of the word "electrobe" to --electrode--.
Col. 14 in claim 13, please correct the spelling of the word "electrobe" to --electrode--.

Col. 14 in claim 14, please correct the spelling of the word "manufaturing" to --manufacturing--.

Signed and Sealed this

Seventeenth Day of June, 2008

JON W. DUDAS
*Director of the United States Patent and Trademark Office*